March 16, 1937. J. B. DOW Re. 20,293

OSCILLATOR SYSTEM

Original Filed April 22, 1931

INVENTOR.
Jennings B. Dow,
BY
Robert A. Lawrence
ATTORNEY.

Reissued Mar. 16, 1937 Re. 20,293

UNITED STATES PATENT OFFICE 20,293

OSCILLATOR SYSTEM

Jennings B. Dow, Washington, D. C.

Original No. 1,943,302, dated January 16, 1934, Serial No. 532,056, April 22, 1931. Application for reissue August 22, 1936, Serial No. 97,424

6 Claims. (Cl. 250—36)

(Granted under the act of March 3, 1883, as amended April 30, 1928; 370 O. G. 757)

My invention relates broadly to electron tube oscillator circuits.

One of the objects of my invention is to provide means for controlling the frequency of oscillation of oscillating electron tube circuits.

Another object of my invention is to provide means for eliminating, for all practical purposes, the effect of variations in the anode voltage supply to oscillating electron tube circuits upon the frequency of oscillation.

Still another object of my invention is to provide means for automatically compensating for the effect upon frequency caused by variations in the anode voltage supply to oscillating electron tube circuits.

Figure 1:
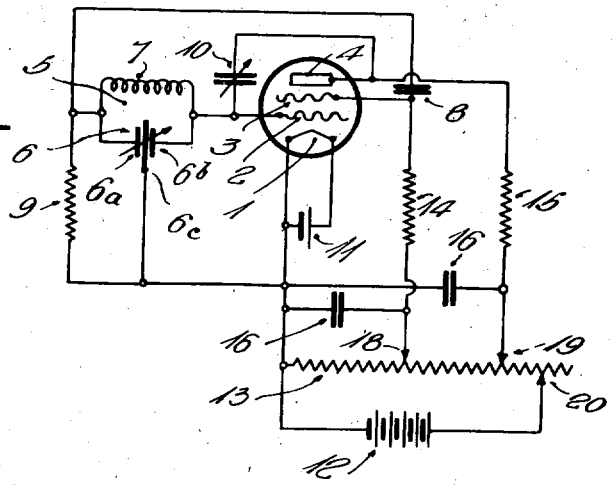
Figure 2:
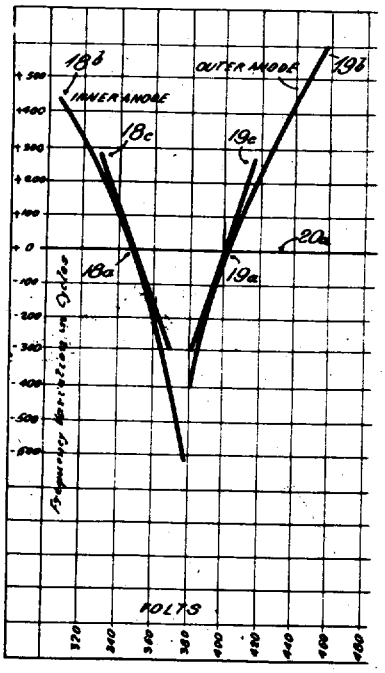
Figure 3:
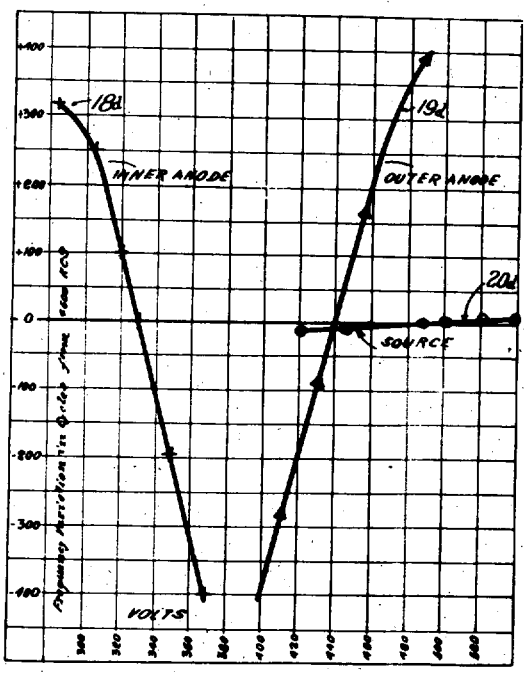

Other and further objects of my invention reside in the arrangement of circuit for constant frequency oscillation generators as set forth more fully in the specification hereinafter following by reference to the accompanying drawing in which:

Figure 1 shows one form of circuit incorporating the features of my invention; Fig. 2 illustrates the principles employed in obtaining automatic compensation for variations in frequency caused by changes in the anode voltage supply of oscillating electron tube circuits; and Fig. 3 shows the results of actual measurements of the automatic compensating effect obtained by the method illustrated in Fig. 2 upon the circuit of Fig. 1.

Fig. 1 illustrates my invention embodied in a circuit arranged for the generation of high frequency oscillations. The circuit shows an electron tube including a cathode 1, a control grid 2, an inner anode 3, and an outer anode 4. The resonant circuit 5 which substantially fixes the frequency of oscillation includes the split-stator variable capacity 6 and the inductance 7. The split-stator condenser 6 has two sets of plates 6*a* and 6*b* capacitatively related to a third or intermediate set of plates 6*c*. A blocking capacity 8 and the leak resistance 9 are connected as shown. A neutralizing capacity is shown at 10. Battery 11 supplies the necessary cathode heating energy, whereas battery 12 supplies the inner and outer anode potentials which are adjustable through the medium of taps 18 and 19 on the potentiometer 13. Battery 12 is fixedly connected to one end of potentiometer 13 and is variably connected through tap 20 adjacent the other end of potentiometer 13. Obviously, the power supply may be taken from direct or alternating current generators. 14 and 15 are impedances that may take many forms although I prefer to employ resistances or inductances. By-pass capacities are shown at 16 connected across the power supply circuits to the inner anode 3 and the outer anode 4. The output energy from the circuit, as shown in Fig. 1, may be delivered to a work circuit by connecting or coupling such work circuit to tuned circuit 5, or to impedance 14 or 15.

By associating with the electron stream of any conventional oscillating tube circuit, an auxiliary element, such as the outer anode element 4, and connecting it with a source of potential preferably through an impedance 15, the frequency of oscillation may be varied over quite a wide range by varying the potential applied to this auxiliary element. I have found that the magnitude of change in frequency for a given change in potential of the auxiliary element as well as the direction of change of frequency, i. e., whether the frequency increases or decreases with an increase in the potential of the auxiliary element, is a function of the potentials applied to the other elements of the tube, the potential of the auxiliary element, and the position of the auxiliary element with respect to the other elements. I have found that this effect may be utilized to great practical advantage in oscillating electron tube circuits.

Fig. 2 illustrates one manner in which the change in frequency caused by varying the potential of an auxiliary element associated with the electron stream of an oscillating electron tube circuit may be utilized. The ordinates represent changes in frequency in cycles above or below a given frequency to which such a circuit as that shown in Fig. 1 may be initially adjusted. The changes in frequency involved in the curves plotted in Fig. 2 are those which result from varying taps 18, 19 and 20 on potentiometer 13 shown in Fig. 1. These changes in frequency are therefore the direct result of varying the inner and outer anode voltages from the initially adjusted values represented by points 18*a*, 19*a* and 20*a*, in Fig. 2.

By making a suitable choice of initially adjusted voltages for the inner and outer anodes, I have found that when tap 18 is varied, meanwhile keeping the position of taps 19 and 20 fixed, the frequency at which the circuit of Fig. 1 oscillates varies in accordance with curve 18*b*, and that when tap 19 is varied, meanwhile keeping the position of taps 18 and 20 fixed, the frequency varies in accordance with curve 19*b*. It will be noted that the slopes of curves 18*b* and 19*b* are opposite in sense. I have found that the slopes of these curves at the points of crossing the axis corresponding to zero change in frequency, may be varied over wide limits by a suitable choice of the initially adjusted voltages corresponding to points 18a and 19a. Obviously then, if such a choice of initially adjusted voltages is made as will make the slopes at points 18a and 19a exactly equal and opposite in sense, no appreciable change in frequency would be expected to take place when varying tap 20 of Fig. 1 over quite a wide range. It is therefore axiomatic that in order to avoid changes in frequency due to momentary variations in the anode voltage supply for vacuum tube oscillators of the two anode type, such a choice of anode voltages should be made as will make the tangents 18c and 19c of equal and opposite slope.

Fig. 3 shows the observed results of an actual application of the principles disclosed in the preceding paragraph. Curves 18d, 19d and 20d of Fig. 3 show respectively the actual changes in the frequency of oscillation of the circuit of Fig. 1 when varying taps 18, 19 and 20. The overall compensating effect is shown by curve 20d.

The resonant circuit 5 is adjusted to a selected frequency by varying the spacial relation of the intermediate set of plates 6c with respect to the sets of plates 6a and 6b. When the selected frequency is obtained, the position of the variable capacity 6 is set and thereafter the circuits continue to generate oscillations at the selected frequency substantially independent of changes or variations in the potential supplied to the inner and outer anodes.

I have made measurements upon the circuit of Fig. 1 which show a change in frequency of only 4 cycles in 4,500,000 for a 25 per cent change in the voltage of battery 12. This change in frequency is less than 0.0001 per cent for a 25 per cent change in the anode voltage supply and indicates the great advantage to be gained in the use of my invention wherever a high degree of precision as to frequency maintenance in vacuum tube oscillators is required.

As variations in the frequency of oscillation of electron tube circuits caused by variations in the anode voltage supply are a frequent source of trouble, particularly in circuits of the self-oscillating types, and especially when the precision maintenance of frequency is essential, the principles of my invention have many important applications.

The circuit of Fig. 1 is only one of many forms of oscillating electron tube circuits to which the present invention is applicable. I have employed my invention with all conventional oscillating electron tube circuits including those of the piezo electric crystal controlled type as well as the self-oscillating type.

While I have described my invention in certain of its preferred embodiments, I desire that it be understood that modifications may be made and that no limitations upon my invention are intended other than are imposed by the scope of the appended claims.

The invention herein disclosed may be manufactured and used by or for the Government of the United States for governmental purposes without the payment of any royalties thereon.

What I claim as new and desire to secure by Letters Patent of the United States is as follows:

1. An oscillation generator comprising an electron tube having cathode, control grid, inner anode and outer anode elements, positioned in the order named, an input circuit connecting said cathode and control grid, an output circuit connecting said cathode and inner anode, means for maintaining said inner anode electro-positive with respect to said cathode, means for regeneratively coupling said circuits for the generation of oscillations by said tube, a second output circuit connecting said cathode and outer anode and means for applying to said outer anode an electro-positive potential proportional at all times to the potential applied to said inner anode and of such value that the change in frequency of oscillation due to changes in the potential of said inner anode will be substantially compensated by the effect of a proportional change in the outer anode potential.

2. An oscillation generator in accordance with claim 1, wherein said means for applying to said outer anode an electro-positive potential proportional at all times to the potential applied to said inner anode comprises a potentiometer device.

3. An oscillation generator comprising an electron tube having cathode, control grid, inner anode and outer anode elements, positioned in the order named, a resonant circuit disposed between said control grid and inner anode and comprising in combination with said cathode the means for oscillation generation, an output circuit disposed between said outer anode and cathode, a neutralizing capacity connected between said output circuit and said means for oscillation generation and potentiometer means for applying to said outer anode a potential proportional at all times to the potential applied to said inner anode and of such value that the frequency of oscillation is substantially independent of changes in the potential of said inner anode.

4. In an oscillating electron tube system comprising an electron tube having a cathode, a control grid, an inner anode and a main outer anode in which the first three elements are connected for oscillation generation and in which the main outer anode is connected for deriving high frequency energy from said system and means for maintaining said anodes electro-positive with respect to said cathode, the method of compensating the changes in the frequency of oscillation resulting from variations in potential of the source of anode potential which comprises applying to the inner anode a potential proportional at all times to the potential applied to the main anode and of such value that the change in frequency due to a change in the outer anode potential will be substantially compensated by the effect of a proportional change in the inner anode potential.

5. In an oscillation generator comprising an electron tube having at least four separate elements, the first three of which are connected to form an oscillation generator, the method of compensating for changes in the frequency of oscillation which comprises selecting for one of the elements of the oscillation generator a positive potential and applying to the element not included in the oscillation generator a different positive potential proportional at all times to the said selected potential and of such value that the change in frequency due to a change in the first-mentioned positive potential is substantially compensated by an opposite effect upon frequency caused by the proportional change in the second-mentioned positive potential.

6. In an oscillation generator having an electron tube including a cathode element, a control element and inner and outer anode elements wherein the cathode, control element and inner anode element are connected to form an oscillation generator and output means is connected between said outer anode and cathode, the method of avoiding frequency changes resulting from changes in a common anode potential source which consists in so choosing the ratio of the potentials applied to the two anodes that the frequency remains substantially constant due to the compensating effect of the two anodes and maintaining the ratio of the potentials as so chosen.

JENNINGS B. DOW.